United States Patent
Domino et al.

(10) Patent No.: US 11,271,602 B2
(45) Date of Patent: Mar. 8, 2022

(54) DIVERSITY RECEIVER FRONT END SYSTEM WITH HETEROGENEOUS VARIABLE-GAIN AMPLIFIERS

(71) Applicant: SKYWORKS SOLUTIONS, INC., Woburn, MA (US)

(72) Inventors: William J. Domino, Yorba Linda, CA (US); Stephane Richard Marie Wloczysiak, Irvine, CA (US); Bipul Agarwal, Irvine, CA (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 0 days.

(21) Appl. No.: 16/596,666

(22) Filed: Oct. 8, 2019

(65) Prior Publication Data
US 2020/0112329 A1 Apr. 9, 2020

Related U.S. Application Data

(63) Continuation of application No. 15/895,930, filed on Feb. 13, 2018, now Pat. No. 10,439,665, which is a
(Continued)

(51) Int. Cl.
*H04L 25/06* (2006.01)
*H04B 1/18* (2006.01)
(Continued)

(52) U.S. Cl.
CPC .......... *H04B 1/18* (2013.01); *H03F 3/19* (2013.01); *H03F 3/72* (2013.01); *H03G 3/3068* (2013.01);
(Continued)

(58) Field of Classification Search
CPC ........ H04B 1/0057; H04B 1/006; H04B 1/18; H04B 1/0458; H04B 2001/0408;
(Continued)

(56) References Cited

U.S. PATENT DOCUMENTS

2006/0041773 A1* 2/2006 Otomo ............... H04N 21/4305
713/503
2007/0026837 A1* 2/2007 Bagchi ................ H04B 1/30
455/333
(Continued)

*Primary Examiner* — Zewdu A Kassa
(74) *Attorney, Agent, or Firm* — Chang & Hale LLP

(57) ABSTRACT

A receiving system includes a controller that selectively activates one or more of a plurality of paths between an input of a first multiplexer and an output of a second multiplexer. The receiving system includes a plurality of bandpass filters, each one of the bandpass filters being disposed along a corresponding one of the plurality of paths and configured to filter a signal received at the bandpass filter to a respective frequency band. The receiving system also includes a plurality of variable-gain amplifiers (VGAs), each one of the plurality of VGAs disposed along a corresponding one of the plurality of paths and configured to amplify a signal received at the VGA with a gain controlled by an amplifier control signal received from the controller. At least one, but not all, of the VGAs is a fixed-gain amplifier with a bypass switch to selectively bypass the fixed-gain amplifier.

20 Claims, 10 Drawing Sheets

Related U.S. Application Data continuation of application No. 14/727,739, filed on Jun. 1, 2015, now Pat. No. 9,893,752.

(60) Provisional application No. 62/073,043, filed on Oct. 31, 2014.

(51) Int. Cl.
| | | |
|---|---|---|
| *H03F 3/19* | (2006.01) | |
| *H04B 7/08* | (2006.01) | |
| *H03G 3/30* | (2006.01) | |
| *H03F 3/72* | (2006.01) | |
| *H04B 1/00* | (2006.01) | |
| *H04B 7/04* | (2017.01) | |

(52) U.S. Cl.
CPC ......... *H04B 1/0057* (2013.01); *H04B 7/0825* (2013.01); *H03F 2200/111* (2013.01); *H03F 2200/294* (2013.01); *H03F 2200/451* (2013.01); *H03F 2203/7209* (2013.01); *H04B 7/04* (2013.01)

(58) Field of Classification Search
CPC ...... H04B 1/48; H04B 1/0475; H04B 1/0483; H04B 1/44; H04B 1/50; H04B 1/3877; H04B 1/001
USPC ................................. 375/318, 316, 219, 295
See application file for complete search history.

(56) References Cited

U.S. PATENT DOCUMENTS

2007/0190961 A1* 8/2007 Igarashi .................. H04B 1/30
455/333
2015/0036725 A1* 2/2015 Chen ...................... H04B 1/406
375/219

* cited by examiner

DIVERSITY RECEIVER FRONT END SYSTEM WITH HETEROGENEOUS VARIABLE-GAIN AMPLIFIERS

CROSS-REFERENCE TO RELATED APPLICATION(S)

This application is a continuation of U.S. patent application Ser. No. 15/895,930 (issued as U.S. Pat. No. 10,439,665 on Oct. 8, 2019) filed Feb. 13, 2018, entitled DIVERSITY RECEIVER FRONT END SYSTEM WITH VARIABLE-GAIN AMPLIFIERS, which is a continuation of U.S. patent application Ser. No. 14/727,739 (issued as U.S. Pat. No. 9,893,752 on Feb. 13, 2018) filed Jun. 1, 2015, entitled DIVERSITY RECEIVER FRONT END SYSTEM WITH VARIABLE-GAIN AMPLIFIERS, which claims priority to U.S. Provisional Application No. 62/073,043 filed Oct. 31, 2014, entitled DIVERSITY RECEIVER FRONT END SYSTEM, the disclosure of each of which is hereby expressly incorporated by reference herein in its entirety for all purposes.

BACKGROUND

Field

The present disclosure generally relates to wireless communication systems having one or more diversity receiving antennas.

Description of the Related Art

In wireless communication applications, size, cost, and performance are examples of factors that can be important for a given product. For example, to increase performance, wireless components such as a diversity receive antenna and associated circuitry are becoming more popular.

In many radio-frequency (RF) applications, a diversity receive antenna is placed physically far from a primary antenna. When both antennas are used at once, a transceiver can process signals from both antennas in order to increase data throughput.

SUMMARY

In accordance with some implementations, the present disclosure relates to a receiving system including a controller configured to selectively activate one or more of a plurality of paths between an input of a first multiplexer and an output of a second multiplexer. The receiving system further includes a plurality of bandpass filters. Each one of the plurality of bandpass filters is disposed along a corresponding one of the plurality of paths and is configured to filter a signal received at the bandpass filter to a respective band. The receiving system further includes a plurality of variable-gain amplifiers (VGAs). Each one of the plurality of VGAs is disposed along a corresponding one of the plurality of paths and is configured to amplifier a signal received at the VGA with a gain controlled by an amplifier control signal received from the controller.

In some embodiments, the controller can be configured to selectively activate the one or more of the plurality of paths based on a band select signal received by the controller. In some embodiments, the controller can be configured to selectively activate the one or more of the plurality of paths by transmitting a splitter control signal to the first multiplexer and a combiner control signal to the second multiplexer. In some embodiments, the controller can be configured to selectively activate the one or more of the plurality of paths by transmitting an amplifier enable signal to one or more of the plurality of VGAs respectively disposed along the one or more of the plurality of paths.

In some embodiments, at least one of the VGAs can include a fixed-gain amplifier and a bypass switch controllable by the amplifier control signal. In some embodiments, at least one of the VGAs can include a step-variable gain amplifier configured to amplify the signal received at the VGA with a gain of one of a plurality of configured amounts indicated by the amplifier control signal or a continuously-variable gain amplifier configured to amplify the signal received at the VGA with a gain proportional to the amplifier control signal. In some embodiments, at least one of the VGAs can include a variable-current amplifier configured to amplify the signal received at the amplifier by drawing an amount of current controlled by the amplifier control signal.

In some embodiments, the amplifier control signal is based on a quality of service metric of an input signal received at the input of the first multiplexer.

In some embodiments, at least one of the VGAs can include a low-noise amplifier.

In some embodiments, the receiving system can further include one or more tunable matching circuits disposed at one or more of the input and the output.

In some embodiments, the receiving system can further include a transmission line coupled to the output of the second multiplexer and coupled to a downstream module including one or more downstream amplifiers. In some embodiments, the controller can be further configured to generate a downstream amplifier control signal based on the amplifier control signal to control a gain of the one or more downstream amplifiers. In some embodiments, at least one of the downstream amplifiers can be coupled to the transmission line without passing through a downstream bandpass filter. In some embodiments, a number of the one or more downstream amplifiers can be less than a number of the VGAs.

In some implementations, the present disclosure relates to a radio-frequency (RF) module that includes a packaging substrate configured to receive a plurality of components. The RF module further includes a receiving system implemented on the packaging substrate. The receiving system includes a controller configured to selectively activate one or more of a plurality of paths between an input of a first multiplexer and an output of a second multiplexer (e.g., an input of the RF module and an output of the RF module). The receiving system further includes a plurality of bandpass filters. Each one of the bandpass filters is disposed along a corresponding one of the plurality of paths and is configured to filter a signal received at the bandpass filter to a respective frequency band. The receiving system further includes a plurality of variable-gain amplifiers (VGAs). Each one of the plurality of VGAs is disposed along a corresponding one of the plurality of paths and is configured to amplify a signal received at the VGA with a gain controlled by an amplifier control signal received from the controller.

In some embodiments, the RF module can be a diversity receiver front-end module (FEM).

In some embodiments, the plurality of paths includes an off-module path. The off-module path can include an off-module bandpass filter and one of the plurality of VGAs.

According to some teachings, the present disclosure relates to a wireless device that includes a first antenna configured to receive a first radio-frequency (RF) signal. The wireless device further includes a first front-end module (FEM) in communication with the first antenna. The first FEM including a packaging substrate configured to receive a plurality of components. The first FEM further includes a receiving system implemented on the packaging substrate. The receiving system includes a controller configured to selectively activate one or more of a plurality of paths between an input of a first multiplexer and an output of a second multiplexer. The receiving system further includes a plurality of bandpass filters. Each one of the plurality of bandpass filters is disposed along a corresponding one of the plurality of paths and is configured to filter a signal received at the bandpass filter to a respective frequency band. The receiving system further includes a plurality of variable-gain amplifiers (VGAs). Each one of the plurality of VGAs is disposed along a corresponding one of the plurality of paths and is configured to amplify a signal received at the VGA with a gain controlled by an amplifier control signal received from the controller. The wireless device further includes a communications module configured to receive a processed version of the first RF signal from the output via a cable and generate data bits based on the processed version of the first RF signal.

In some embodiments, the wireless device further includes a second antenna configured to receive a second radio-frequency (RF) signal and a second FEM in communication with the second antenna. The communications module can be configured to receive a processed version of the second RF signal from an output of the second FEM and generate the data bits based on the processed version of the second RF signal.

In some embodiment, the wireless device includes a communications controller configured to control the first FEM and a gain of one or more downstream amplifiers of the communications module.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

Figure 1:
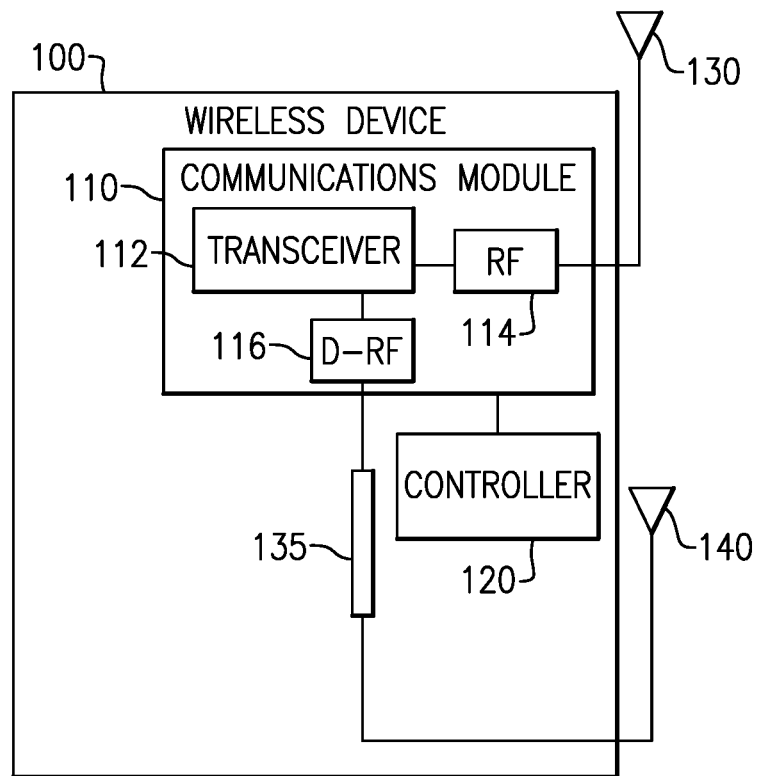
FIG. 1 shows a wireless device having a communications module coupled to a primary antenna and a diversity antenna.

FIG. 1 shows a wireless device 100 having a communications module 110 coupled to a primary antenna 130 and a diversity antenna 140. The communications module 110 (and its constituent components) may be controlled by a controller 120. The communications module 110 includes a transceiver 112 that is configured to convert between analog radio-frequency (RF) signals and digital data signals. To that end, the transceiver 112 may include a digital-to-analog converter, an analog-to-digital converter, a local oscillator for modulating or demodulating a baseband analog signal to or from a carrier frequency, a baseband processor that converts between digital samples and data bits (e.g., voice or other types of data), or other components.

The communications module 110 further includes an RF module 114 coupled between the primary antenna 130 and the transceiver 112. Because the RF module 114 may be physically close to the primary antenna 130 to reduce attenuation due to cable loss, the RF module 114 may be referred to as front-end module (FEM). The RF module 114 may perform processing on an analog signal received from the primary antenna 130 for the transceiver 112 or received from transceiver 112 for transmission via the primary antenna 130. To that end, the RF module 114 may include filters, power amplifiers, band select switches, matching circuits, and other components. Similarly, the communications module 110 includes a diversity RF module 116 coupled between the diversity antenna 140 and the transceiver 112 that performs similar processing.

When a signal is transmitted to the wireless device, the signal may be received at both the primary antenna 130 and the diversity antenna 140. The primary antenna 130 and diversity antenna 140 may be physically spaced apart such that the signal at the primary antenna 130 and diversity antenna 140 is received with different characteristics. For example, in one embodiment, the primary antenna 130 and diversity antenna 140 may receive the signal with different attenuation, noise, frequency response, or phase shift. The transceiver 112 may use both of the signals with different characteristics to determine data bits corresponding to the signal. In some implementations, the transceiver 112 selects from between the primary antenna 130 and the diversity antenna 140 based on the characteristics, such as selecting the antenna with the highest signal-to-noise ratio. In some implementations, the transceiver 112 combines the signals from the primary antenna 130 and the diversity antenna 140 to increase the signal-to-noise ratio of the combined signal.

In some implementations, the transceiver 112 processes the signals to perform multiple-input/multiple-output (MIMO) communication.

Because the diversity antenna 140 is physically spaced apart from the primary antenna 130, the diversity antenna 140 is coupled to the communications module 110 by transmission line 135, such as a cable or a printed circuit board (PCB) trace. In some implementations, the transmission line 135 is lossy and attenuates the signal received at the diversity antenna 140 before it reaches the communications module 110. Thus, in some implementations, as described below, gain is applied to the signal received at the diversity antenna 140. The gain (and other analog processing, such as filtering) may be applied by a diversity receiver module. Because such a diversity receiver module may be located physically close to the diversity antenna 140, it may be referred to a diversity receiver front-end module.

Figure 2:
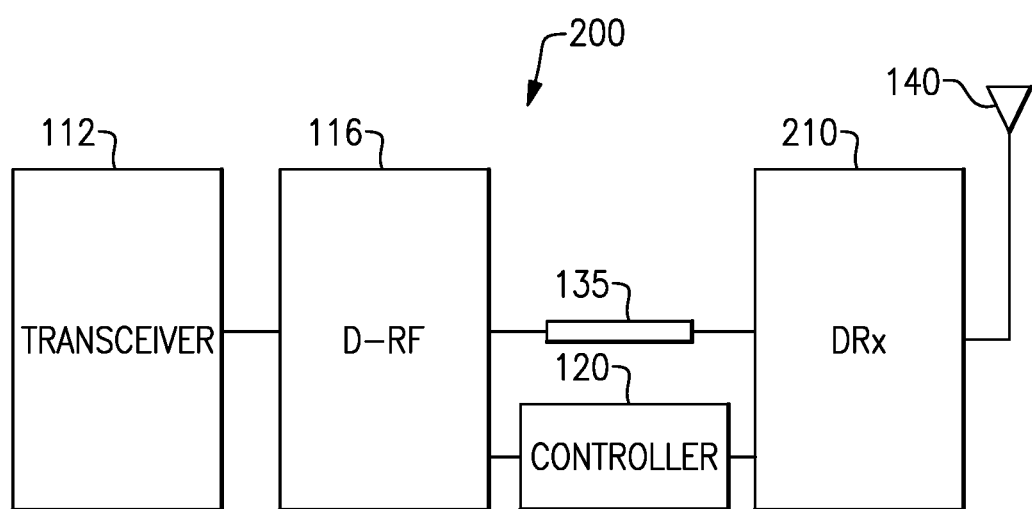
FIG. 2 shows a diversity receiver (DRx) configuration including a DRx front-end module (FEM).

FIG. 2 shows a diversity receiver (DRx) configuration 200 including a DRx front-end module (FEM) 210. The DRx configuration 200 includes a diversity antenna 140 that is configured to receive a diversity signal and provide the diversity signal to the DRx FEM 210. The DRx FEM 210 is configured to perform processing on the diversity signal received from the diversity antenna 140. For example, the DRx FEM 210 may be configured to filter the diversity signal to one or more active frequency bands, e.g., as indicated by the controller 120. As another example, the DRx FEM 210 may be configured to amplify the diversity signal. To that end, the DRx FEM 210 may include filters, low-noise amplifiers, band select switches, matching circuits, and other components.

The DRx FEM 210 transmits the processed diversity signal via a transmission line 135 to a downstream module, such as the diversity RF (D-RF) module 116, which feeds a further processed diversity signal to the transceiver 112. The diversity RF module 116 (and, in some implementations, the transceiver), is controlled by the controller 120. In some implementations the controller 120 may be implemented within transceiver 112.

Figure 3A:
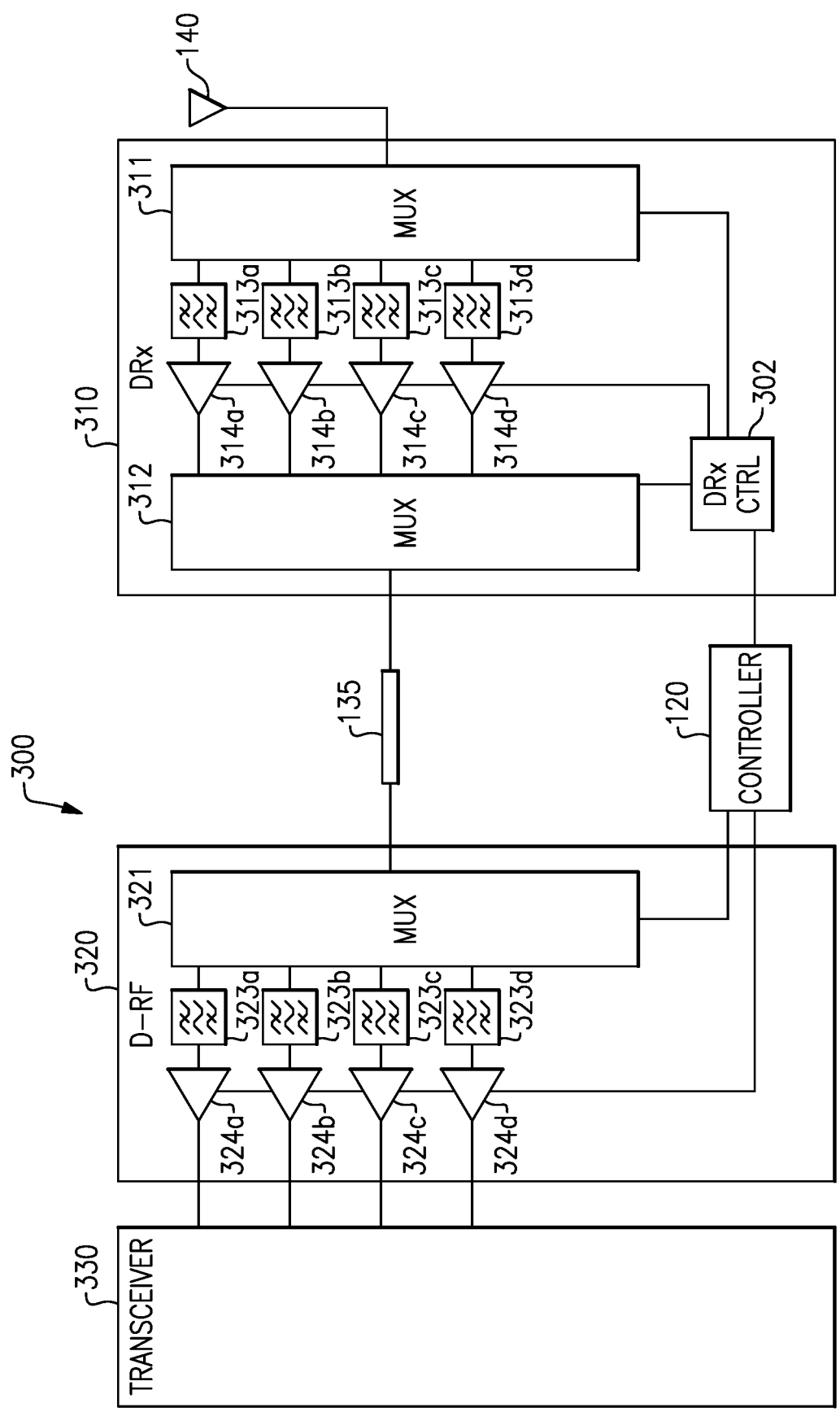
FIG. 3A shows that in some embodiments, a diversity receiver (DRx) configuration may include a DRx module with multiple paths corresponding to multiple frequency bands.

FIG. 3A shows that in some embodiments, a diversity receiver (DRx) configuration 300 may include a DRx module 310 with multiple paths corresponding to multiple frequency bands. The DRx configuration 300 includes a diversity antenna 140 configured to receive a diversity signal. In some implementations, the diversity signal may be a single-band signal including data modulated onto a single frequency band. In some implementations, the diversity signal may be a multi-band signal (also referred to as an inter-band carrier aggregation signal) including data modulated onto multiple frequency bands.

The DRx module 310 has an input that receives the diversity signal from the diversity antenna 140 and an output that provides a processed diversity signal to the transceiver 330 (via the transmission line 135 and the diversity RF module 320). The DRx module 310 input feeds into an input of first multiplexer (MUX) 311. The first multiplexer 311 includes a plurality of multiplexer outputs, each corresponding to a path between the input and the output of the DRx module 310. Each of the paths may correspond to a respective frequency band. The DRx module 310 output is provided by the output of second multiplexer 312. The second multiplexer 312 includes a plurality of multiplexer inputs, each corresponding to one of the paths between the input and the output of the DRx module 310.

The frequency bands may be cellular frequency bands, such as UMTS (Universal Mobile Telecommunications System) frequency bands. For example, a first frequency band may be UMTS (Universal Mobile Telecommunications System) downlink or "Rx" Band 2, between 1930 megahertz (MHZ) and 1990 MHz, and a second frequency band may be UMTS downlink or "Rx" Band 5, between 869 MHz and 894 MHz. Other downlink frequency bands may be used, such as those described below in Table 1 or other non-UMTS frequency bands.

In some implementations, the DRx module 310 includes a DRx controller 302 that receives signals from the controller 120 (also referred to as a communications controller) and, based on the received signals, selectively activates one or more of the plurality of paths between the input and the output. In some implementations, the DRx module 310 does not include a DRx controller 302 and the controller 120 selectively activates the one or more of the plurality of paths directly.

As noted above, in some implementations, the diversity signal is a single-band signal. Thus, in some implementations, the first multiplexer 311 is a single-pole/multiple-throw (SPMT) switch that routes the diversity signal to one of the plurality of paths corresponding to the frequency band of the single-band signal based on a signal received from the DRx controller 302. The DRx controller 302 may generate the signal based on a band select signal received by the DRx controller 302 from the communications controller 120. Similarly, in some implementations, the second multiplexer 312 is a SPMT switch that routes the signal from the one of the plurality of paths corresponding to the frequency band of the single-band signal based on a signal received from the DRx controller 302.

As noted above, in some implementations, the diversity signal is a multi-band signal. Thus, in some implementations, the first multiplexer 311 is a band splitter that routes the diversity signal to two or more of the plurality of paths corresponding to the two or more frequency bands of the multi-band signal based on a splitter control signal received from the DRx controller 302. The function of the band splitter may be implemented as a SPMT switch, a diplexer filter, or some combination of these. Similarly, in some implementations, the second multiplexer 312 is a band combiner that combines the signals from the two or more of the plurality of paths corresponding to the two or more frequency bands of the multi-band signal based on a combiner control signal received from the DRx controller 302. The function of the band combiner may be implemented as a SPMT switch, a diplexer filter, or some combination of these. The DRx controller 302 may generate the splitter control signal and the combiner control signal based on a band select signal received by the DRx controller 302 from the communications controller 120.

Thus, in some implementations, the DRx controller 302 is configured to selectively activate one or more of the plurality of paths based on a band select signal received by the DRx controller 302 (e.g., from the communications controller 120). In some implementations, the DRx controller 302 is configured to selectively activate one or more of the plurality of paths by transmitting a splitter control signal to a band splitter and a combiner control signal to a band combiner.

The DRx module 310 includes a plurality of bandpass filters 313a-313d. Each one of the bandpass filters 313a-313d is disposed along a corresponding one of the plurality of paths and configured to filter a signal received at the bandpass filter to the respective frequency band of the one of the plurality of paths. In some implementations, the bandpass filters 313a-313d are further configured to filter a signal received at the bandpass filter to a downlink frequency sub-band of the respective frequency band of the one of the plurality of paths. The DRx module 310 includes a plurality of amplifiers 314a-314d. Each one of the amplifiers 314a-314d is disposed along a corresponding one of the plurality of paths and configured to amplify a signal received at the amplifier.

In some implementations, the amplifiers 314a-314d are narrowband amplifiers configured to amplify a signal within the respective frequency band of the path in which the amplifier is disposed. In some implementations, the amplifiers 314a-314d are controllable by the DRx controller 302. For example, in some implementations, each of the amplifiers 314a-314d includes an enable/disable input and is enabled (or disabled) based on an amplifier enable signal received and the enable/disable input. The amplifier enable signal may be transmitted by the DRx controller 302. Thus, in some implementations, the DRx controller 302 is configured to selectively activate one or more of the plurality of paths by transmitting an amplifier enable signal to one or more of the amplifiers 314a-314d respectively disposed along the one or more of the plurality of paths. In such implementations, rather than being controlled by the DRx controller 302, the first multiplexer 311 may be a band splitter that routes the diversity signal to each of the plurality of paths and the second multiplexer 312 may be a band combiner that combines the signals from each of the plurality of paths. However, in implementations in which the DRx controller 302 controls the first multiplexer 311 and second multiplexer 312, the DRX controller 302 may also enable (or disable) particular amplifiers 314a-314d, e.g., to save battery.

In some implementations, the amplifiers 314a-314d are variable-gain amplifiers (VGAs). Thus, in some implementations, the DRx module 310 includes a plurality of variable-gain amplifiers (VGAs), each one of the VGAs disposed along a corresponding one of the plurality of paths and configured to amplify a signal received at the VGA with a gain controlled by an amplifier control signal received from the DRx controller 302.

Figure 3B:
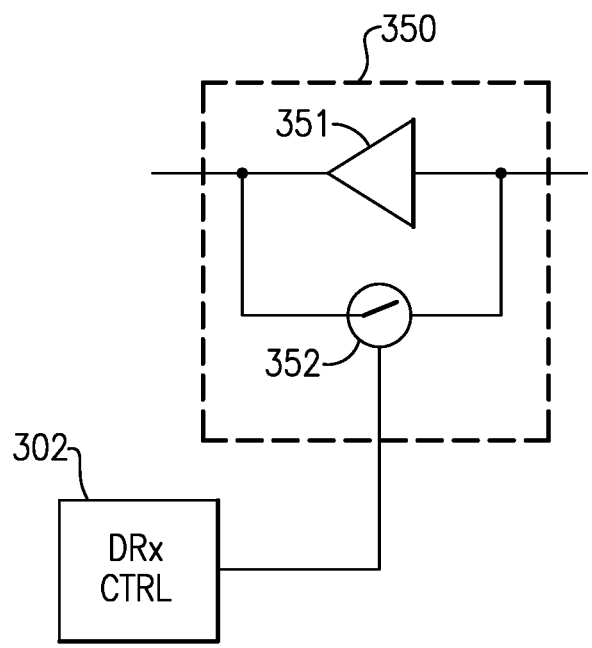
FIG. 3B shows that in some embodiments, the gain of a variable-gain amplifier may be bypassable.

The gain of a VGA may be bypassable, step-variable, or continuously-variable. FIG. 3B shows that in some embodiments, a variable-gain amplifier 350 may be bypassable. The VGA 350 includes a fixed-gain amplifier 351 and a bypass switch 352 controllable by an amplifier control signal produced by the DRx controller 302. The bypass switch 352 may (in a first position) close a line from an input of the fixed-gain amplifier 351 to an output of the fixed-gain amplifier, allowing a signal to bypass the fixed-gain amplifier 351. The bypass switch 352 may (in a second position) open the line between the input of the fixed-gain amplifier 351 and the output of the fixed-gain amplifier 351, passing a signal through the fixed-gain amplifier 351. In some implementations, when the bypass switch is in the first position, the fixed-gain amplifier is disabled or otherwise reconfigured to accommodate the bypass mode. Returning to FIG. 3A, in some implementations, at least one of the VGAs 314a-314d includes a fixed-gain amplifier and a bypass switch controllable by the amplifier control signal.

Figure 3C:
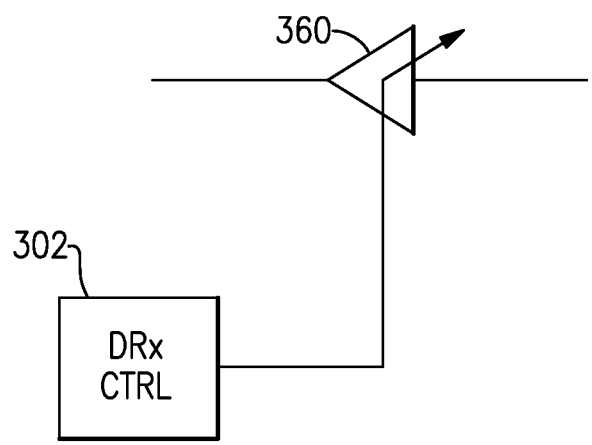
FIG. 3C shows that in some embodiments, the gain of a variable-gain amplifier may be step-variable or continuously-variable.

FIG. 3C shows that in some embodiments, the gain of a variable-gain amplifier 360 may be step-variable or continuously-variable. In some implementations, the VGA 360 is step-variable and, in response to a digital amplifier control signal produced by the DRx controller 302, amplifies the signal received at the input of the VGA 360 with a gain of one of a plurality of configured amounts indicated by the digital signal. In some implementations, the VGA 360 is continuously-variable and, in response to an analog amplifier control signal produced by the DRx controller 302, amplifies the signal received at the input of the VGA 360 with a gain proportional to characteristic (e.g., a voltage or duty cycle) of the analog signal. Returning to FIG. 3A, in some implementations, at least one of the VGAs 314a-314d includes a step-variable gain amplifier configured to amplify the signal received at the VGA with a gain of one of plurality of configured amounts indicated by the amplifier control signal. In some implementations, at least one of the VGAs 314a-314d includes a continuously-variable gain amplifier configured to amplify a signal received at the VGA with a gain proportional to the amplifier control signal.

In some implementations, the amplifiers 314a-314d are variable-current amplifiers (VCAs). The current drawn by a VCA may be bypassable, step-variable, continuously-variable. In some implementations, at least one of the VCAs includes a fixed-current amplifier and a bypass switch controllable by the amplifier control signal. The bypass switch may (in a first position) close a line between an input of the fixed-current amplifier to an output of fixed-current amplifier, allowing a signal to bypass the fixed-current amplifier. The bypass switch may (in a second position) open the line between the input and the output, passing a signal through the fixed-current amplifier. In some implementations, when the bypass switch is in the first position, the fixed-current amplifier is disabled or otherwise reconfigured to accommodate the bypass mode.

In some implementations, at least one of the VCAs includes a step-variable current amplifier configured to amplify the signal received at the VCA by drawing a current of one of plurality of configured amounts indicated by the amplifier control signal. In some implementations, at least one of the VCAs includes a continuously-variable current amplifier configured to amplify a signal received at the VCA by drawing a current proportional to the amplifier control signal.

In some implementations, the amplifiers 314a-314d are fixed-gain, fixed-current amplifiers. In some implementations, the amplifiers 314a-314d are fixed-gain, variable-current amplifiers. In some implementations, the amplifiers 314a-314d are variable-gain, fixed-current amplifiers. In some implementations, the amplifiers 314a-314d are variable-gain, variable-current amplifiers.

In some implementations, the DRx controller 302 generates the amplifier control signal(s) based on a quality of service metric of an input signal received at the input of the first multiplexer 311. In some implementations, the DRx controller 302 generates the amplifier control signal(s) based on a signal received from the communications controller 120, which may, in turn, be based on a quality of service (QoS) metric of the received signal. The QoS metric of the received signal may be based, at least in part, on the diversity signal received on the diversity antenna 140 (e.g., an input signal received at the input). The QoS metric of the received signal may be further based on a signal received on a primary antenna. In some implementations, the DRx controller 302 generates the amplifier control signal(s) based on a QoS metric of the diversity signal without receiving a signal from the communications controller 120.

In some implementations, the QoS metric includes a signal strength. As another example, the QoS metric may include a bit error rate, a data throughput, a transmission delay, or any other QoS metric.

As noted above, the DRx module 310 has an input that receives the diversity signal from the diversity antenna 140 and an output that provides a processed diversity signal to the transceiver 330 (via the transmission line 135 and the diversity RF module 320). The diversity RF module 320 receives the processed diversity signal via the transmission line 135 and performs further processing. In particular, the processed diversity signal is split or routed by a diversity RF multiplexer 321 to one or more paths on which the split or routed signal is filtered by corresponding bandpass filters 323a-323d and amplified by corresponding amplifiers 324a-324d. The output of each of the amplifiers 324a-324d is provided to the transceiver 330.

The diversity RF multiplexer 321 may be controlled by the controller 120 (either directly or via or an on-chip diversity RF controller) to selectively activate one or more of the paths. Similarly, the amplifiers 324a-324d may be controlled by the controller 120. For example, in some implementations, each of the amplifiers 324a-324d includes an enable/disable input and is enabled (or disabled) based on an amplifier enable signal. In some implementations, the amplifiers 324a-324d are variable-gain amplifiers (VGAs) that amplify a signal received at the VGA with a gain controlled by an amplifier control signal received from the controller 120 (or an on-chip diversity RF controller controlled by the controller 120). In some implementations, the amplifiers 324a-324d are variable-current amplifiers (VCAs).

With the DRx module 310 added to the receiver chain already including the diversity RF module 320, the number of bandpass filters in the DRx configuration 300 is doubled. Thus, in some implementations, bandpass filters 323a-323d are not included in the diversity RF module 320. Rather, the bandpass filters 313a-313d of the DRx module 310 are used to reduce the strength of out-of-band blockers. Further, the automatic gain control (AGC) table of the diversity RF module 320 may be shifted to reduce the amount of gain provided by the amplifiers 324a-324d of the diversity RF module 320 by the amount of the gain provided by the amplifiers 314a-314d of the DRx module 310.

For example, if the DRx module gain is 15 dB and the receiver sensitivity is −100 dBm, the diversity RF module 320 will see −85 dBm of sensitivity. If the closed-loop AGC of the diversity RF module 320 is active, its gain will drop by 15 dB automatically. However, both signal components and out-of-band blockers are received amplified by 15 dB. Thus, in some implementations, the 15 dB gain drop of the diversity RF module 320 is accompanied by a 15 dB increase in its linearity. In particular, the amplifiers 324a-324d of the diversity RF module 320 may be designed such that the linearity of the amplifiers increases with reduced gain (or increased current).

In some implementations, the controller 120 controls the gain (and/or current) of the amplifiers 314a-314d of the DRx module 310 and the amplifiers 324a-324d of the diversity RF module 320. As in the example above, the controller 120 may reduce an amount of gain provided by the amplifiers 324a-324d of the diversity RF module 320 in response to increasing an amount of gain provided by the amplifiers 314a-314d of the DRx module 310. Thus, in some implementations, the controller 120 is configured to generate a downstream amplifier control signal (for the amplifiers 324a-324d of the diversity RF module 320) based on the amplifier control signal (for the amplifiers 314a-314d of the DRx module 310) to control a gain of one or more downstream amplifiers 324a-324d coupled to the output (of the DRx module 310) via the transmission line 135. In some implementations, the controller 120 also controls the gain of other components of the wireless device, such as amplifiers in the front-end module (FEM), based on the amplifier control signal.

As noted above, in some implementations, the bandpass filters 323a-323d are not included. Thus, in some implementations, at least one of the downstream amplifiers 324a-324d are coupled to the output (of the DRx module 310) via the transmission line 135 without passing through a downstream bandpass filter.

Figure 4:
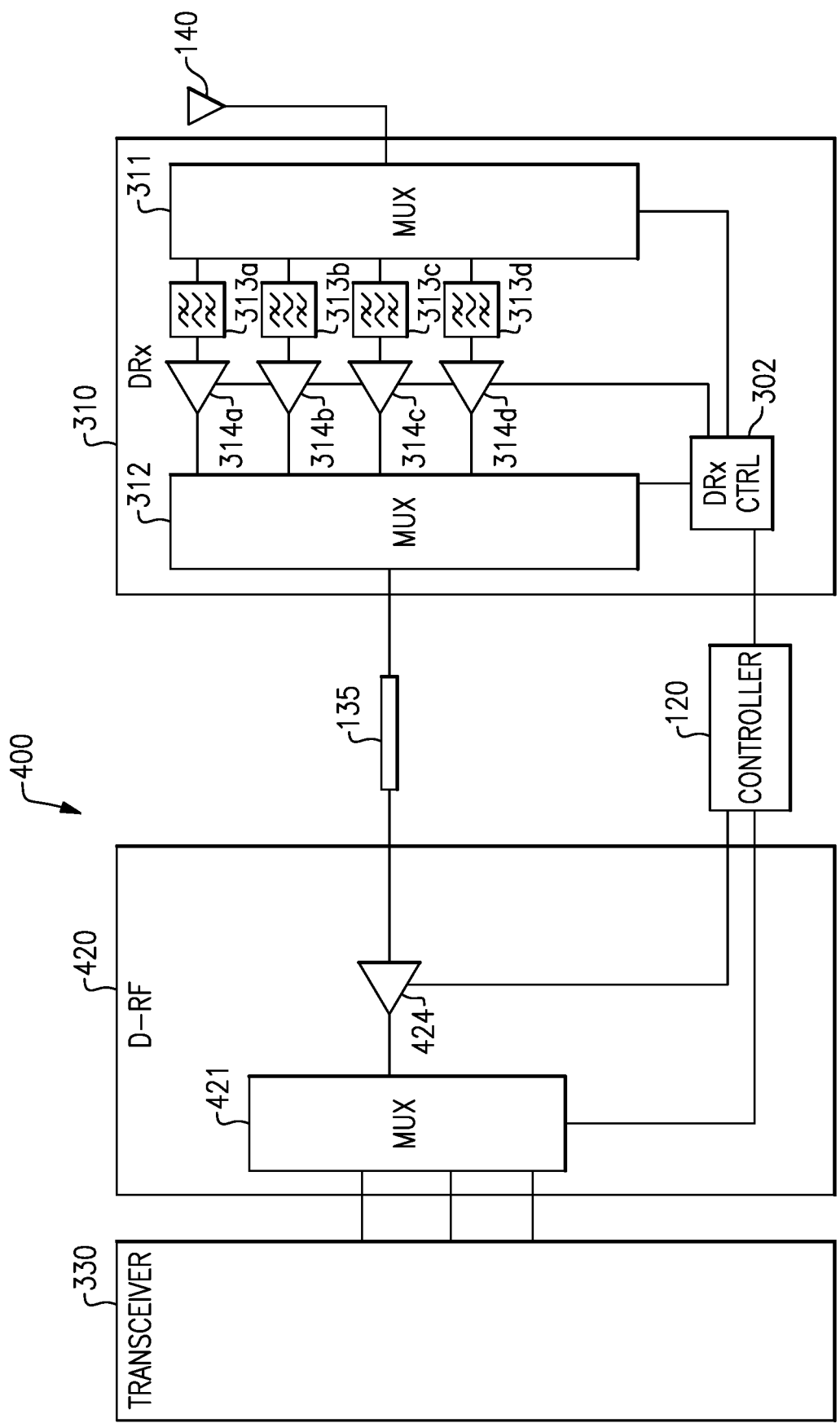
FIG. 4 shows that in some embodiments, a diversity receiver configuration may include a diversity RF module with fewer amplifiers than a diversity receiver (DRx) module.

FIG. 4 shows that in some embodiments, a diversity receiver configuration 400 may include a diversity RF module 420 with fewer amplifiers than a diversity receiver (DRx) module 310. The diversity receiver configuration 400 includes a diversity antenna 140 and a DRx module 310 as described above with respect to FIG. 3A. The output of the DRx module 310 is passed, via a transmission line 135, to a diversity RF module 420 which differs from the diversity RF module 320 of FIG. 3A in that the diversity RF module 420 of FIG. 4 includes fewer amplifiers than the DRx module 310.

As mentioned above, in some implementations, the diversity RF module 420 does not include bandpass filters. Thus, in some implementations, the one or more amplifiers 424 of the diversity RF module 420 need not be band-specific. In particular, the diversity RF module 420 may include one or more paths, each including an amplifier 424, that are not mapped 1-to-1 with the paths DRx module 310. Such a mapping of paths (or corresponding amplifiers) may be stored in the controller 120.

Accordingly, whereas the DRx module 310 includes a number of paths, each corresponding to a frequency band, the diversity RF module 420 may include one or more paths that do not correspond to a single frequency band.

In some implementations (as shown in FIG. 4), the diversity RF module 420 includes a single wide-band or tunable amplifier 424 that amplifies the signal received from the transmission line 135 and outputs an amplified signal to a multiplexer 421. The multiplexer 421 includes a plurality of multiplexer outputs, each corresponding to a respective frequency band. In some implementations, the diversity RF module 420 does not include any amplifiers.

In some implementations, the diversity signal is a single-band signal. Thus, in some implementations, the multiplexer 421 is a single-pole/multiple-throw (SPMT) switch that routes the diversity signal to one of the plurality of outputs corresponding to the frequency band of the single-band signal based on a signal received from the controller 120. In some implementations, the diversity signal is a multi-band signal. Thus, in some implementations, the multiplexer 421 is a band splitter that routes the diversity signal to two or more of the plurality of outputs corresponding to the two or more frequency bands of the multi-band signal based on a splitter control signal received from the controller 120. In some implementations, diversity RF module 420 may be combined with the transceiver 330 as a single module.

In some implementations, the diversity RF module 420 includes multiple amplifiers, each corresponding to a set of frequency bands. The signal from the transmission line 135 may be fed into a band splitter that outputs high frequencies along a first path to a high-frequency amplifier and outputs low frequencies along a second path to a low-frequency amplifier. The output of each of the amplifiers may be provided to the multiplexer 421 which is configured to route the signal to the corresponding inputs of the transceiver 330.

Figure 5:
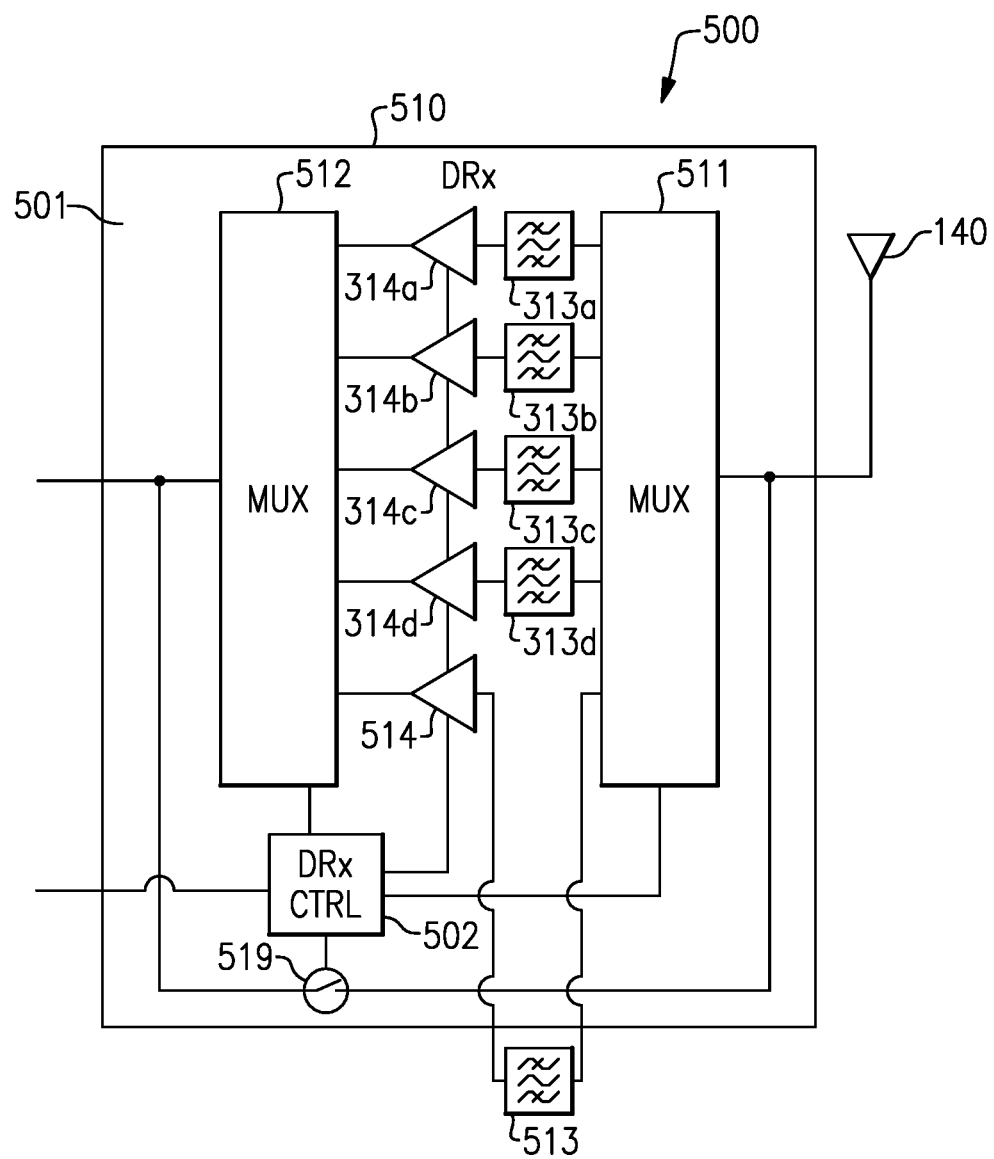
FIG. 5 shows that in some embodiments, a diversity receiver configuration may include a DRx module coupled to an off-module filter.

FIG. 5 shows that in some embodiments, a diversity receiver configuration 500 may include a DRx module 510 coupled to an off-module filter 513. The DRx module 510 may include a packaging substrate 501 configured to receive a plurality of components and a receiving system implemented on the packaging substrate 501. The DRx module 510 may include one or more signal paths that are routed off the DRx module 510 and made available to a system integrator, designer, or manufacturer to support a filter for any desired band.

The DRx module 510 includes a number of paths between the input and the output of the DRx module 510. The DRx module 510 includes a bypass path between the input and the output activated by a bypass switch 519 controlled by the DRx controller 502. Although FIG. 5 illustrates a single bypass switch 519, in some implementations, the bypass switch 519 may include multiple switches (e.g., a first switch disposed physically close to the input and a second switch disposed physically close to the output. As shown in FIG. 5, the bypass path does not include a filter or an amplifier.

The DRx module 510 includes a number of multiplexer paths including a first multiplexer 511 and a second multiplexer 512. The multiplexer paths include a number of on-module paths that include the first multiplexer 511, a bandpass filter 313a-313d implemented on the packaging substrate 501, an amplifier 314a-314d implemented on the packaging substrate 501, and the second multiplexer 512. The multiplexer paths include one or more off-module paths that include the first multiplexer 511, a bandpass filter 513 implemented off the packaging substrate 501, an amplifier 514, and the second multiplexer 512. The amplifier 514 may be a wide-band amplifier implemented on the packaging substrate 501 or may also be implemented off the packaging substrate 501. As described above, the amplifiers 314a-314d, 514 may be variable-gain amplifiers and/or variable-current amplifiers.

The DRx controller 502 is configured to selectively activate one or more of the plurality of paths between the input and the output. In some implementations, the DRx controller 502 is configured to selectively activate one or more of the plurality of paths based on a band select signal received by the DRx controller 502 (e.g., from a communications controller). The DRx controller 502 may selectively activate the paths by, for example, opening or closing the bypass switch 519, enabling or disabling the amplifiers 314a-314d, 514, controlling the multiplexers 511, 512, or through other mechanisms. For example, the DRx controller 502 may open or close switches along the paths (e.g., between the filters 313a-313d, 513 and the amplifiers 314a-314d, 514) or by setting the gain of the amplifiers 314a-314d, 514 to substantially zero.

Figure 6:
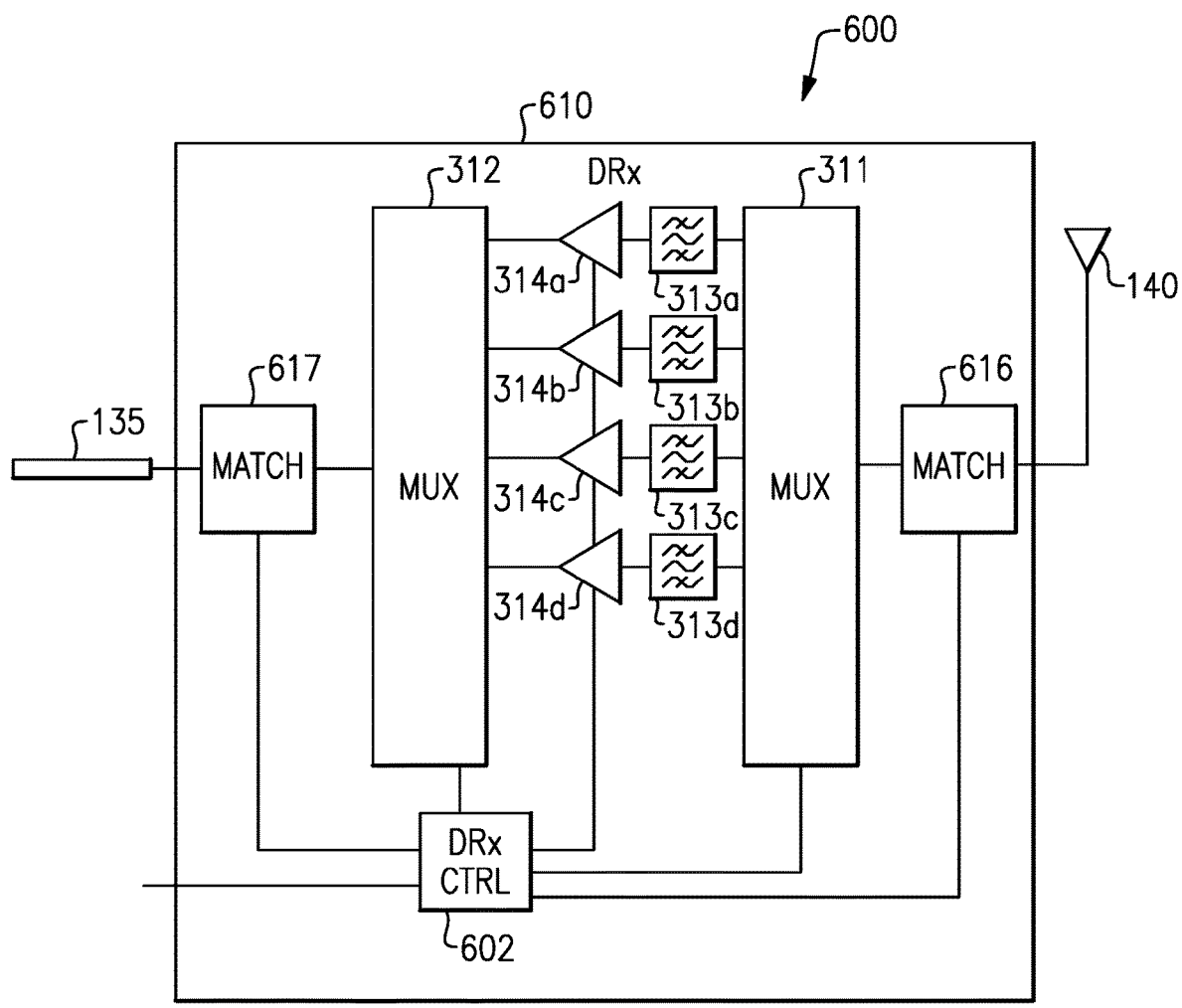
FIG. 6 shows that in some embodiments, a diversity receiver configuration may include a DRx module with tunable matching circuits.

FIG. 6 shows that in some embodiments, a diversity receiver configuration 600 may include a DRx module 610 with tunable matching circuits. In particular, the DRx module 610 may include one or more tunable matching circuits disposed at one or more of the input and the output of the DRx module 610.

Multiple frequency bands received on the same diversity antenna 140 are unlikely to all see an ideal impedance match. To match each frequency band using a compact matching circuit, a tunable input matching circuit 616 may be implemented at the input of the DRx module 610 and controlled by the DRx controller 602 (e.g., based on a band select signal from a communications controller). The DRx controller 602 may tune the tunable input matching circuit 616 based on a lookup table that associates frequency bands (or sets of frequency bands) with tuning parameters. The tunable input matching circuit 616 may be a tunable T-circuit, a tunable PI-circuit, or any other tunable matching circuit. In particular, the tunable input matching circuit 616 may include one or more variable components, such as resistors, inductors, and capacitors. The variable components may be connected in parallel and/or in series and may be connected between the input of the DRx module 610 and the input of the first multiplexer 311 or may be connected between the input of the DRx module 610 and a ground voltage.

Similarly, with only one transmission line 135 (or, at least, few cables) carrying signals of many frequency bands, it is not likely that multiple frequency bands will all see an ideal impedance match. To match each frequency band using a compact matching circuit, a tunable output matching circuit 617 may be implemented at the output of the DRx module 610 and controlled by the DRx controller 602 (e.g., based on a band select signal from a communications controller). The DRx controller 602 may tune the tunable output matching circuit 618 based on a lookup table that associates frequency bands (or sets of frequency bands) with tuning parameters. The tunable output matching circuit 617 may be a tunable T-circuit, a tunable PI-circuit, or any other tunable matching circuit. In particular, the tunable output matching circuit 617 may include one or more variable components, such as resistors, inductors, and capacitors. The variable components may be connected in parallel and/or in series and may be connected between the output of the DRx module 610 and the output of the second multiplexer 312 or may be connected between the output of the DRx module 610 and a ground voltage.

Figure 7:
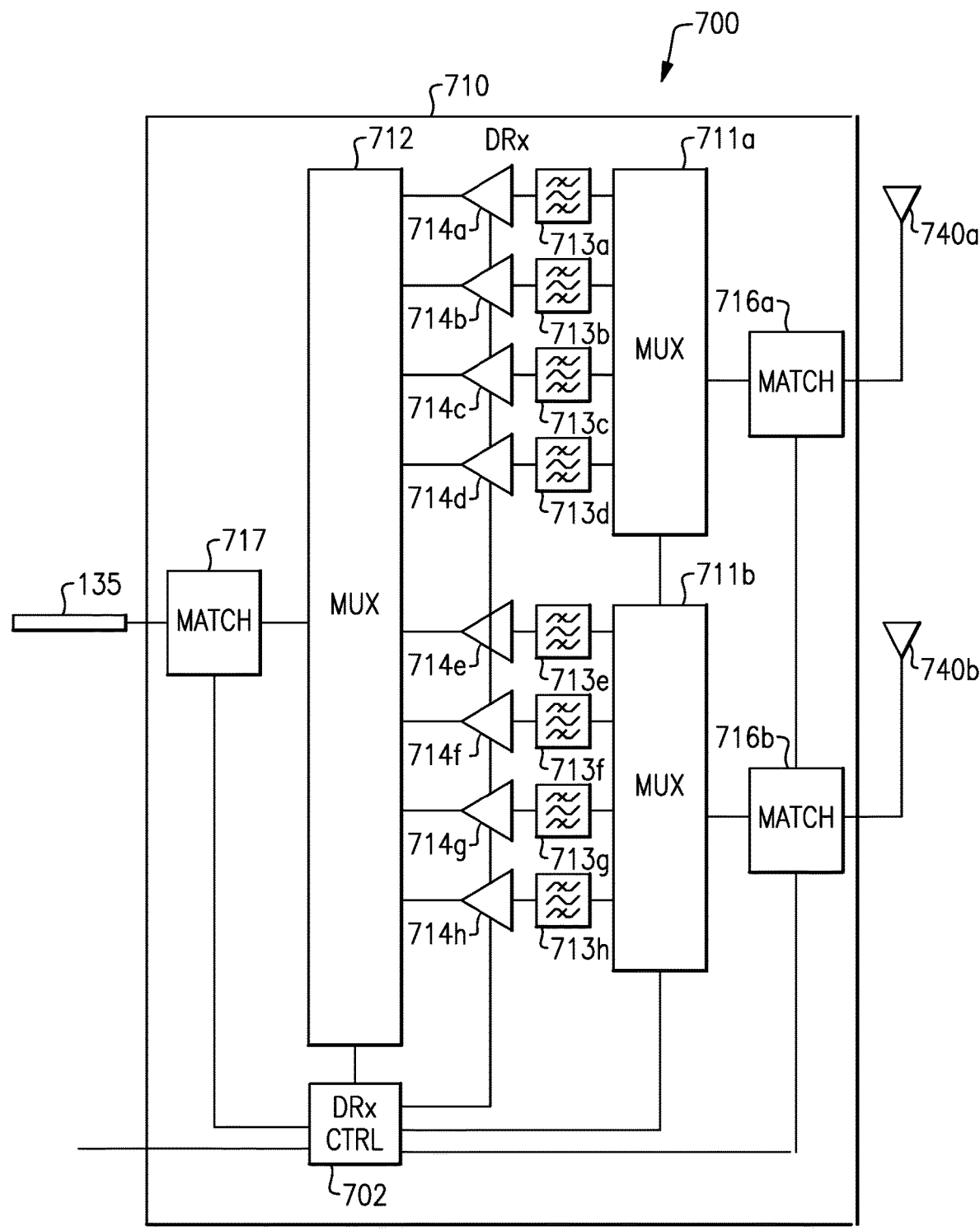
FIG. 7 shows that in some embodiments, a diversity receiver configuration may include multiple antennas.

FIG. 7 shows that in some embodiments, a diversity receiver configuration 700 may include multiple antennas. Although FIG. 7 illustrates an embodiment with two antennas 740a-740b and one transmission line 135, aspects described herein may be implemented in embodiments with more than two antennas and/or two or more cables.

The diversity receiver configuration 700 includes a DRx module 710 coupled to a first antenna 740a and a second antenna 740b. In some implementations, the first antenna 740a is a high-band antenna configured to receive signals transmitted at higher frequency bands and the second antenna 740b is a low-band antenna configured to receive signals transmitted at lower frequency bands.

The DRx module 710 includes a first tunable input matching circuit 716a at a first input of the DRx module 710 and a second tunable input matching circuit 716b at a second input of the DRx module 710. The DRx module 710 further includes a tunable output matching circuit 717 at the output of the DRx module 710. The DRx controller 702 may tune each of the tunable matching circuits 716a-716b, 717 based on a lookup table that associates frequency bands (or sets of frequency bands) with tuning parameters. Each of the tunable matching circuits 716a-716b, 717 may be a tunable T-circuit, a tunable PI-circuit, or any other tunable matching circuit.

The DRx module 710 includes a number of paths between the inputs (the first input coupled to the first antenna 740a and the second input coupled to the second antenna 740b) and the output (coupled to the transmission line 135) of the DRx module 710. In some implementations, the DRx module 710 includes one or more bypass paths (not shown) between the inputs and the output activated by one or more bypass switches controlled by the DRx controller 702.

The DRx module 710 includes a number of multiplexer paths including one of a first input multiplexer 711a or a second input multiplexer 711b and including an output multiplexer 712. The multiplexer paths include a number of on-module paths (shown) that include one of the tunable input matching circuit 716a-716b, one of the input multiplexers 711a-711b, a bandpass filter 713a-713h, an amplifier 714a-714h, the output multiplexer 712, and the output matching circuit 717. The multiplexer paths may include one or more off-module paths (not shown) as described above. As also described above, the amplifiers 714a-714h may be variable-gain amplifiers and/or variable-current amplifiers.

The DRx controller 702 is configured to selectively activate one or more of the plurality of paths between the input and the output. In some implementations, the DRx controller 702 is configured to selectively activate one or more of the plurality of paths based on a band select signal received by the DRx controller 702 (e.g., from a communications controller). In some implementations, the DRx controller 702 is configured to tune the tunable matching circuits 716a-716b, 717 based on the band select signal. The DRx controller 702 may selectively activate the paths by, for example, enabling or disabling the amplifiers 714a-714h, controlling the multiplexers 711a-711b, 712, or through other mechanisms as described above.

Figure 8:
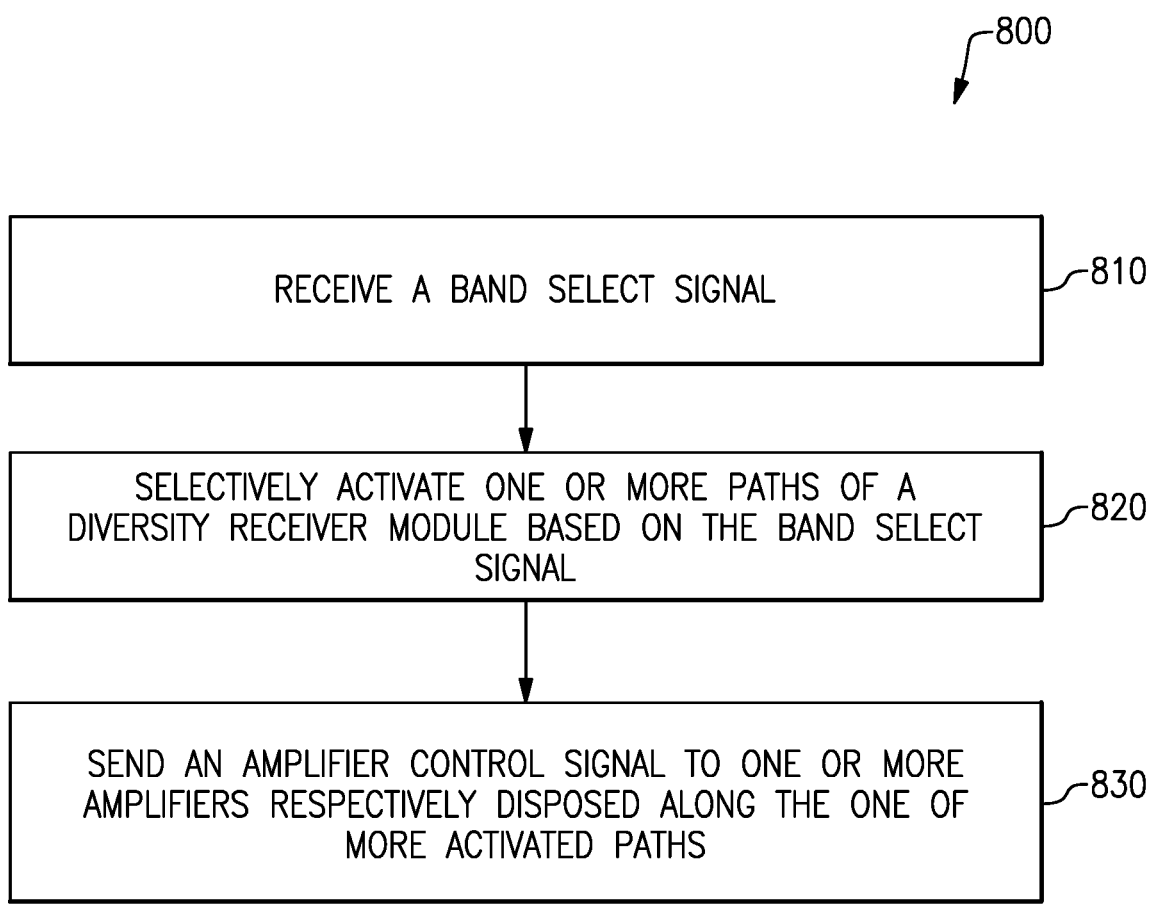
FIG. 8 shows an embodiment of a flowchart representation of a method of processing an RF signal.

FIG. 8 shows an embodiment of a flowchart representation of a method of processing an RF signal. In some implementations (and as detailed below as an example), the method 800 is performed by a controller, such as the DRx controller 302 of FIG. 3A or the communications controller 120 of FIG. 3A. In some implementations, the method 800 is performed by processing logic, including hardware, firmware, software, or a combination thereof. In some implementations, the method 800 is performed by a processor executing code stored in a non-transitory computer-readable medium (e.g., a memory). Briefly, the method 800 includes receiving a band select signal and routing a received RF signal along one or more gain-controlled paths to process the received RF signal.

The method 800 begins, at block 810, with the controller receiving a band select signal. The controller may receive the band select signal from another controller or may receive the band select signal from a cellular base station or other external source. The band select signal may indicate one or more frequency bands over which a wireless device is to transmit and receive RF signals. In some implementations, the band select signal indicates a set of frequency bands for carrier aggregation communication.

In some implementations, the controller tunes one or more tunable matching circuits based on the received band select signal. For example, the controller may tune the tunable matching circuits based on a lookup table that associates frequency bands (or sets of frequency bands) indicated by the band select signal with tuning parameters.

At block 820, the controller selectively activates one or more paths of a diversity receiver (DRx) module based on the band select signal. As described above, a DRx module may include a number of paths between one or more inputs (coupled to one or more antennas) and one or more outputs (coupled to one or more cables) of the DRx module. The paths may include bypass paths and multiplexer paths. The multiplexer paths may include on-module paths and off-module paths.

The controller may selectively activate one or more of the plurality of paths by, for example, opening or closing one or more bypass switches, enabling or disabling amplifiers disposed along the paths via an amplifier enable signal, controlling one or more multiplexers via a splitter control signal and/or a combiner control signal, or through other mechanisms. For example, the controller may open or close switches disposed along the paths or by setting the gain of the amplifiers disposed along the paths to substantially zero.

At block 830, the controller sends an amplifier control signal to one or more amplifiers respectively disposed along the one or more activated paths. The amplifier control signal controls the gain (or current) of the amplifier to which it is sent. In one embodiment, the amplifier includes a fixed-gain amplifier and a bypass switch controllable by the amplifier control signal. Thus, in one embodiment, the amplifier control signal indicates whether the bypass switch is to be open or closed.

In one embodiment, the amplifier includes a step-variable gain amplifier configured to amplify the signal received at the amplifier with a gain of one of a plurality of configured amounts indicated by the amplifier control signal. Thus, in one embodiment, the amplifier control signal indicates one of a plurality of configured amounts.

In one embodiment, the amplifier includes a continuously-variable gain amplifier configured to amplify the signal received at the amplifier with a gain proportional to the amplifier control signal. Thus, in one embodiment, the amplifier control signal indicates a proportional amount of gain.

In some implementations, the controller generates the amplifier control signal(s) based on a quality of service (QoS) metric of an input signal received at the input. In some implementations, the controller generates the amplifier control signal(s) based on a signal received from another controller, which may, in turn, be based on a QoS metric of the received signal. The QoS metric of the received signal may be based, at least in part, on the diversity signal received on the diversity antenna (e.g., an input signal received at the input). The QoS metric of the received signal may be further based on a signal received on a primary antenna. In some implementations, the controller generates the amplifier control signal(s) based on a QoS metric of the diversity signal without receiving a signal from another controller. For example, the QoS metric may include a signal strength. As another example, the QoS metric may include a bit error rate, a data throughput, a transmission delay, or any other QoS metric.

In some implementations, the controller, in block 830, also sends a downstream amplifier control signal based on the amplifier control signal to control a gain of one or more downstream amplifiers coupled to the output via one or more cables.

Figure 9:
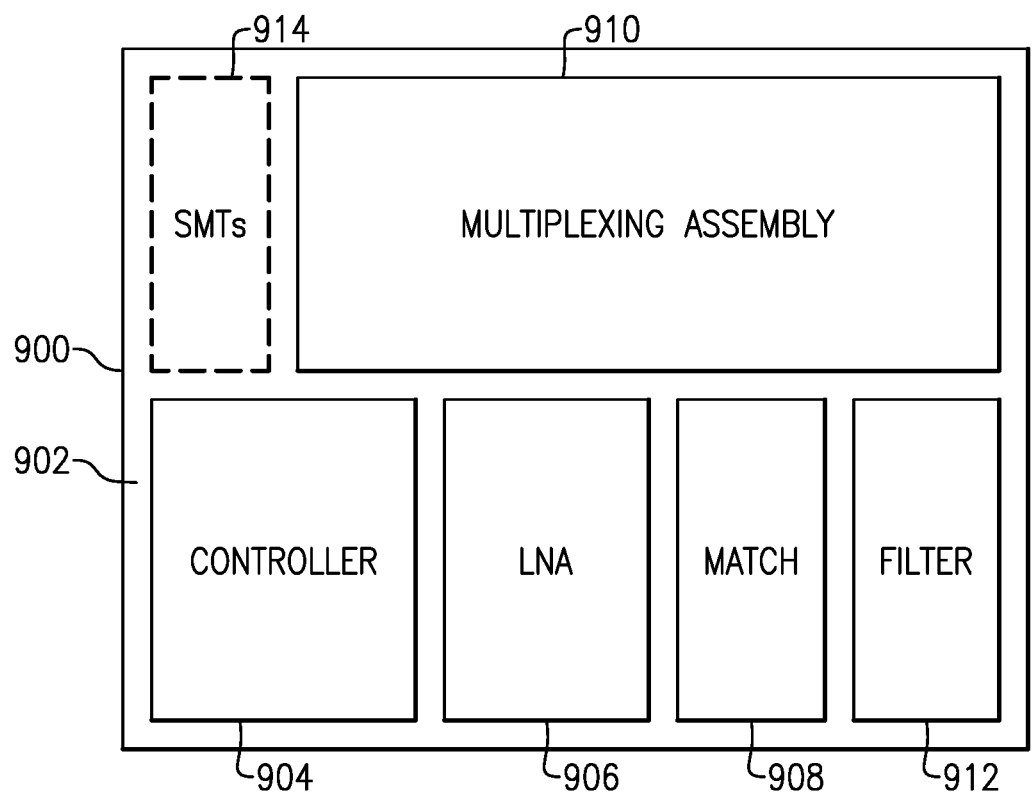
FIG. 9 depicts a module having one or more features as described herein.

FIG. 9 shows that in some embodiments, some or all of the diversity receiver configurations (e.g., those shown in FIGS. 3A, 4, 5, 6, and 7) can be implemented, wholly or partially, in a module. Such a module can be, for example, a front-end module (FEM). Such a module can be, for example, a diversity receiver (DRx) FEM. In the example of FIG. 9, a module 900 can include a packaging substrate 902, and a number of components can be mounted on such a packaging substrate 902. For example, a controller 904 (which may include a front-end power management integrated circuit [FE-PIMC]), a low-noise amplifier assembly 906 (which may include one or more variable-gain amplifiers), a match component 908 (which may include one or more tunable matching circuits), a multiplexer assembly 910, and a filter bank 912 (which may include one or more bandpass filters) can be mounted and/or implemented on and/or within the packaging substrate 902. Other components, such as a number of SMT devices 914, can also be mounted on the packaging substrate 902. Although all of the various components are depicted as being laid out on the packaging substrate 902, it will be understood that some component(s) can be implemented over other component(s).

In some implementations, a device and/or a circuit having one or more features described herein can be included in an RF electronic device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 10:
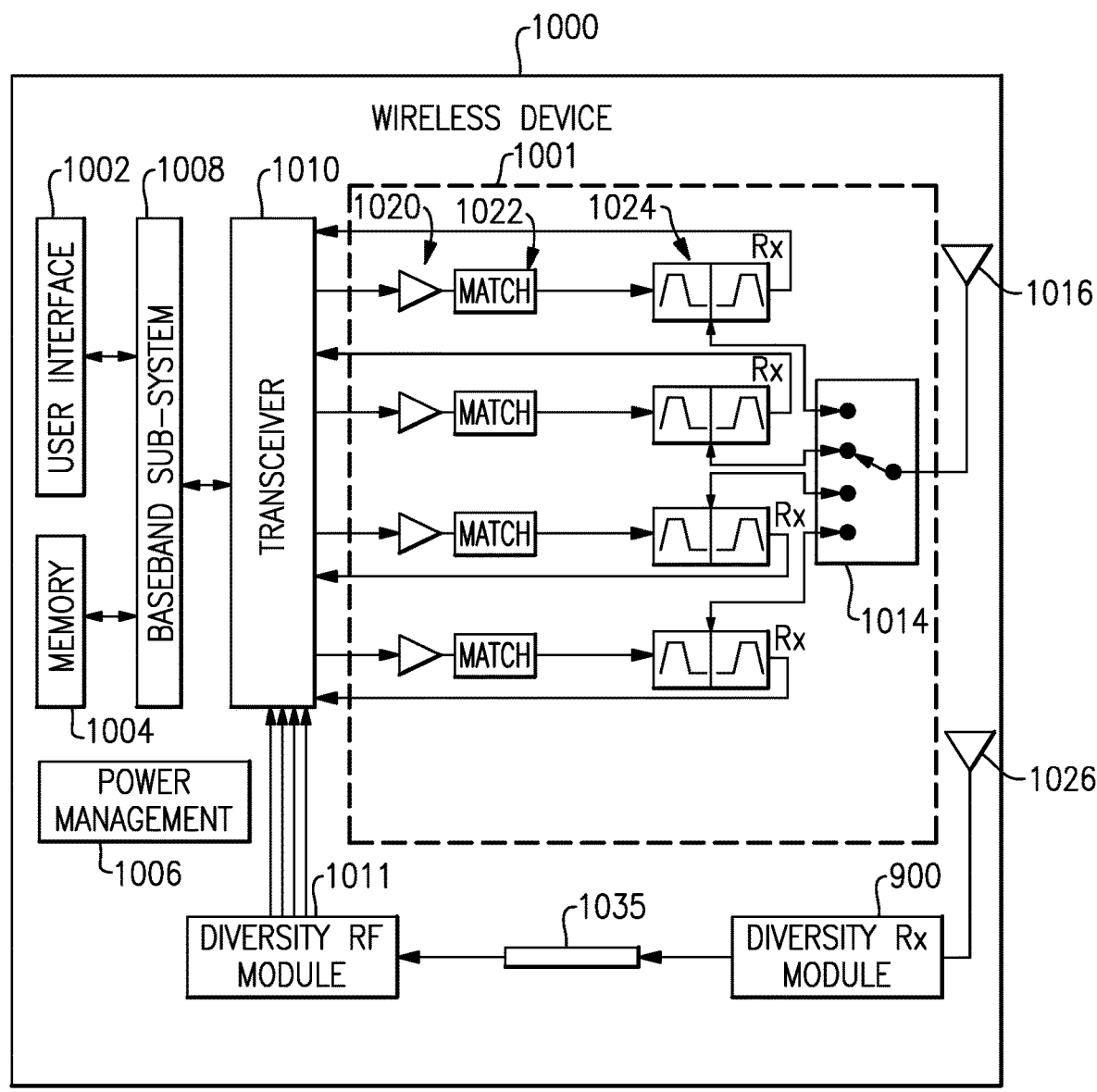
FIG. 10 depicts a wireless device having one or more features described herein.

FIG. 10 depicts an example wireless device 1000 having one or more advantageous features described herein. In the context of one or more modules having one or more features as described herein, such modules can be generally depicted by a dashed box 1001 (which can be implemented as, for example, a front-end module), a diversity RF module 1011 (which can be implemented as, for example, a downstream module), and a diversity receiver (DRx) module 900 (which can be implemented as, for example, a front-end module)

Referring to FIG. 10, power amplifiers (PAs) 1020 can receive their respective RF signals from a transceiver 1010 that can be configured and operated in known manners to generate RF signals to be amplified and transmitted, and to process received signals. The transceiver 1010 is shown to interact with a baseband sub-system 1008 that is configured to provide conversion between data and/or voice signals suitable for a user and RF signals suitable for the transceiver 1010. The transceiver 1010 can also be in communication with a power management component 1006 that is configured to manage power for the operation of the wireless device 1000. Such power management can also control operations of the baseband sub-system 1008 and the modules 1001, 1011, and 900.

The baseband sub-system 1008 is shown to be connected to a user interface 1002 to facilitate various input and output of voice and/or data provided to and received from the user. The baseband sub-system 1008 can also be connected to a memory 1004 that is configured to store data and/or instructions to facilitate the operation of the wireless device, and/or to provide storage of information for the user.

In the example wireless device 1000, outputs of the PAs 1020 are shown to be matched (via respective match circuits 1022) and routed to their respective duplexers 1024. Such amplified and filtered signals can be routed to a primary antenna 1016 through an antenna switch 1014 for transmission. In some embodiments, the duplexers 1024 can allow transmit and receive operations to be performed simultaneously using a common antenna (e.g., primary antenna 1016). In FIG. 10, received signals are shown to be routed to "Rx" paths that can include, for example, a low-noise amplifier (LNA).

The wireless device also includes a diversity antenna 1026 and a diversity receiver module 900 that receives signals from the diversity antenna 1026. The diversity receiver module 900 processes the received signals and transmits the processed signals via a cable 1035 to a diversity RF module 1011 that further processes the signal before feeding the signal to the transceiver 1010.

One or more features of the present disclosure can be implemented with various cellular frequency bands as described herein. Examples of such bands are listed in Table 1. It will be understood that at least some of the bands can be divided into sub-bands. It will also be understood that one or more features of the present disclosure can be implemented with frequency ranges that do not have designations such as the examples of Table 1.

TABLE 1

| Band | Mode | Tx Frequency Range (MHz) | Rx Frequency Range (MHz) |
| --- | --- | --- | --- |
| B1 | FDD | 1,920-1,980 | 2,110-2,170 |
| B2 | FDD | 1,850-1,910 | 1,930-1,990 |
| B3 | FDD | 1,710-1,785 | 1,805-1,880 |
| B4 | FDD | 1,710-1,755 | 2,110-2,155 |
| B5 | FDD | 824-849 | 869-894 |
| B6 | FDD | 830-840 | 875-885 |
| B7 | FDD | 2,500-2,570 | 2,620-2,690 |
| B8 | FDD | 880-915 | 925-960 |
| B9 | FDD | 1,749.9-1,784.9 | 1,844.9-1,879.9 |
| B10 | FDD | 1,710-1,770 | 2,110-2,170 |
| B11 | FDD | 1,427.9-1,447.9 | 1,475.9-1,495.9 |
| B12 | FDD | 699-716 | 729-746 |
| B13 | FDD | 777-787 | 746-756 |
| B14 | FDD | 788-798 | 758-768 |
| B15 | FDD | 1,900-1,920 | 2,600-2,620 |
| B16 | FDD | 2,010-2,025 | 2,585-2,600 |
| B17 | FDD | 704-716 | 734-746 |
| B18 | FDD | 815-830 | 860-875 |
| B19 | FDD | 830-845 | 875-890 |
| B20 | FDD | 832-862 | 791-821 |
| B21 | FDD | 1,447.9-1,462.9 | 1,495.9-1,510.9 |
| B22 | FDD | 3,410-3,490 | 3,510-3,590 |
| B23 | FDD | 2,000-2,020 | 2,180-2,200 |
| B24 | FDD | 1,626.5-1,660.5 | 1,525-1,559 |
| B25 | FDD | 1,850-1,915 | 1,930-1,995 |
| B26 | FDD | 814-849 | 859-894 |
| B27 | FDD | 807-824 | 852-869 |
| B28 | FDD | 703-748 | 758-803 |
| B29 | FDD | N/A | 716-728 |
| B30 | FDD | 2,305-2,315 | 2,350-2,360 |
| B31 | FDD | 452.5-457.5 | 462.5-467.5 |
| B33 | TDD | 1,900-1,920 | 1,900-1,920 |
| B34 | TDD | 2,010-2,025 | 2,010-2,025 |
| B35 | TDD | 1,850-1,910 | 1,850-1,910 |
| B36 | TDD | 1,930-1,990 | 1,930-1,990 |
| B37 | TDD | 1,910-1,930 | 1,910-1,930 |
| B38 | TDD | 2,570-2,620 | 2,570-2,620 |
| B39 | TDD | 1,880-1,920 | 1,880-1,920 |
| B40 | TDD | 2,300-2,400 | 2,300-2,400 |
| B41 | TDD | 2,496-2,690 | 2,496-2,690 |
| B42 | TDD | 3,400-3,600 | 3,400-3,600 |
| B43 | TDD | 3,600-3,800 | 3,600-3,800 |
| B44 | TDD | 703-803 | 703-803 |

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A receiving system comprising:
a controller configured to selectively activate one or more of a plurality of paths between an input of a first multiplexer and an output of a second multiplexer based on a band select signal received by the controller;
a plurality of bandpass filters, each one of the plurality of bandpass filters disposed along a corresponding one of the plurality of paths and configured to filter a signal received at the bandpass filter to a respective frequency band; and
a plurality of variable-gain amplifiers (VGAs), each one of the plurality of VGAs disposed along a corresponding one of the plurality of paths and configured to amplify a signal received at the VGA with a gain controlled by an amplifier control signal received from the controller, with at least one, and less than all, of the plurality of VGAs comprises a fixed-gain amplifier and a bypass switch to bypass the fixed-gain amplifier, the bypass switch controlled by the amplifier control signal, at least one of the plurality of VGAs including a low-noise amplifier, the controller configured to selectively activate the one or more of the plurality of paths by transmitting a splitter control signal to the first multiplexer and a combiner signal to the second multiplexer.

2. The receiving system of claim 1 wherein the controller is configured to selectively activate the one or more of the plurality of paths by transmitting an amplifier enable signal to one or more of the plurality of VGAs respectively disposed along the one or more of the plurality of paths.

3. The receiving system of claim 1 wherein at least one of the plurality of VGAs includes a step-variable gain amplifier configured to amplify the signal received at the VGA with a gain of one of a plurality of configured amounts indicated by the amplifier control signal.

4. The receiving system of claim 1 wherein at least one of the plurality of VGAs includes a continuously-variable gain amplifier configured to amplify the signal received at the VGA with a gain proportional to the amplifier control signal.

5. The receiving system of claim 1 wherein at least one of the plurality of VGAs includes a variable-current amplifier configured to amplify the signal received at the amplifier by drawing an amount of current controlled by the amplifier control signal.

6. The receiving system of claim 1 wherein the amplifier control signal is based at least in part on a quality of service metric of an input signal received at the input of the first multiplexer.

7. The receiving system of claim 1 further comprising a transmission line coupled to the output of the second multiplexer and coupled to a downstream module including one or more downstream amplifiers.

8. The receiving system of claim 7 wherein the controller is further configured to generate a downstream amplifier control signal based at least on part on the amplifier control signal to control a gain of the one or more downstream amplifiers.

9. The receiving system of claim 7 wherein at least one of the downstream amplifiers is coupled to the transmission line without passing through a downstream bandpass filter.

10. The receiving system of claim 7 wherein a number of the one or more downstream amplifiers is less than a number of the plurality of VGAs.

11. A radio-frequency (RF) module comprising:
a packaging substrate configured to receive a plurality of components; and
a receiving system implemented on the packaging substrate, the receiving system including a controller configured to selectively activate one or more of a plurality of paths between an input of a first multiplexer and an output of a second multiplexer based on a band select signal received by the controller; the receiving system also including a plurality of bandpass filters, each one of the plurality of bandpass filters disposed along a corresponding one of the plurality of paths and configured to filter a signal received at the bandpass filter to a respective frequency band; and the receiving system also including a plurality of variable-gain amplifiers (VGAs), each one of the plurality of VGAs disposed along a corresponding one of the plurality of paths and configured to amplify a signal received at the VGA with a gain controlled by an amplifier control signal received from the controller, with at least one, and less than all, of the plurality of VGAs comprises a fixed-gain amplifier and a bypass switch to bypass the fixed-gain amplifier, the bypass switch controlled by the amplifier control signal, at least one of the plurality of VGAs including a low-noise amplifier, the controller configured to selectively activate the one or more of the plurality of paths by transmitting a splitter control signal to the first multiplexer and a combiner signal to the second multiplexer.

12. The RF module of claim 11 wherein the RF module is a diversity receiver front-end module (FEM).

13. The RF module of claim 11 wherein the plurality of paths includes an off-module path that includes an off-module bandpass filter and one of the plurality of VGAs.

14. The RF module of claim 11 wherein the amplifier control signal is based at least in part on a quality of service metric of an input signal received at the input of the first multiplexer.

15. The RF module of claim 11 further comprising a transmission line coupled to the output of the second multiplexer and coupled to a module downstream of the RF module, the downstream module including one or more downstream amplifiers.

16. A wireless device comprising:

a first antenna configured to receive a first radio-frequency (RF) signal;

a first front-end module (FEM) in communication with the first antenna, the first FEM having a receiving system including a controller configured to selectively activate one or more of a plurality of paths between an input of a first multiplexer and an output of a second multiplexer based on a band select signal received by the controller; the receiving system also including a plurality of bandpass filters, each one of the plurality of bandpass filters disposed along a corresponding one of the plurality of paths and configured to filter a signal received at the bandpass filter to a respective frequency band; and the receiving system also including a plurality of variable-gain amplifiers (VGAs), each one of the plurality of VGAs disposed along a corresponding one of the plurality of paths and configured to amplify a signal received at the VGA with a gain controlled by an amplifier control signal received from the controller, with at least one, and less than all, of the plurality of VGAs comprises a fixed-gain amplifier and a bypass switch to bypass the fixed-gain amplifier, the bypass switch controlled by the amplifier control signal, at least one of the plurality of VGAs including a low-noise amplifier, the controller configured to selectively activate the one or more of the plurality of paths by transmitting a splitter control signal to the first multiplexer and a combiner signal to the second multiplexer; and a transceiver configured to receive a processed version of the first RF signal from the output of the second multiplexer and to generate data bits based on the processed version of the first RF signal.

17. The wireless device of claim 16 further comprising a second antenna configured to receive a second RF signal and a second FEM in communication with the second antenna, the transceiver configured to receive a processed version of the second RF signal from an output of the second FEM and to generate data bits based on the processed version of the second RF signal.

18. The wireless device of claim 16 wherein the amplifier control signal is based at least in part on a quality of service metric of an input signal received at the input of the first multiplexer.

19. The RF module of claim 11 wherein the controller is configured to selectively activate the one or more of the plurality of paths by transmitting an amplifier enable signal to one or more of the plurality of VGAs respectively disposed along the one or more of the plurality of paths.

20. The wireless device of claim 16 further comprising a transmission line coupled to the output of the second multiplexer and coupled to a module downstream of the first FEM, the downstream module including one or more downstream amplifiers.

\* \* \* \* \*